(12) United States Patent
Furuyama

(10) Patent No.: US 7,623,743 B2
(45) Date of Patent: Nov. 24, 2009

(54) OPTOELECTRONIC INTERCONNECTION BOARD, OPTOELECTRONIC INTERCONNECTION APPARATUS, AND MANUFACTURING METHOD THEREOF

(75) Inventor: Hideto Furuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/942,238

(22) Filed: Nov. 19, 2007

(65) Prior Publication Data

US 2008/0181561 A1    Jul. 31, 2008

(30) Foreign Application Priority Data

Dec. 26, 2006    (JP)    ............................. 2006-350007

(51) Int. Cl.
*G02B 6/12*    (2006.01)
(52) U.S. Cl. .......................................... 385/14; 385/88
(58) Field of Classification Search ................ 385/4, 385/8, 10, 12, 129, 130, 131, 132, 134
See application file for complete search history.

(56) References Cited

U.S. PATENT DOCUMENTS

| | | | | | |
|---|---|---|---|---|---|
| 4,892,374 | A | * | 1/1990 | Ackerman et al. ............. | 385/49 |
| 5,355,386 | A | * | 10/1994 | Rothman et al. ......... | 372/50.21 |
| 5,436,996 | A | * | 7/1995 | Tabasky et al. ............... | 385/89 |
| 5,574,811 | A | * | 11/1996 | Bricheno et al. ............. | 385/52 |
| 5,604,832 | A | * | 2/1997 | Hall et al. ...................... | 385/89 |
| 5,621,837 | A | * | 4/1997 | Yamada et al. ................ | 385/88 |
| 5,703,973 | A | * | 12/1997 | Mettler et al. ................. | 385/14 |
| 5,999,269 | A | * | 12/1999 | Haugsjaa et al. ............. | 356/401 |
| 6,023,339 | A | * | 2/2000 | Haugsjaa et al. ............. | 356/401 |
| 6,027,255 | A | * | 2/2000 | Joo et al. ....................... | 385/88 |
| 6,069,991 | A | * | 5/2000 | Hibbs-Brenner et al. ...... | 385/50 |
| 6,088,498 | A | * | 7/2000 | Hibbs-Brenner et al. ...... | 385/52 |
| 6,090,635 | A | * | 7/2000 | Rothman et al. ............... | 438/24 |
| 6,101,210 | A | * | 8/2000 | Bestwick et al. .............. | 372/96 |
| 6,181,856 | B1 | * | 1/2001 | Brun ............................ | 385/52 |
| 6,374,021 | B1 | * | 4/2002 | Nakanishi et al. ............. | 385/49 |

(Continued)

FOREIGN PATENT DOCUMENTS

JP    3612243    10/2004

OTHER PUBLICATIONS

Yuzo Ishii, et al., "SMT-Compatible Optical-I/O Chip Packaging for Chip-Level Optical Interconnects", Proc. IEEE Electronic Components and Technology Conference, 2001, 6 pages.

*Primary Examiner*—Frank G Font
*Assistant Examiner*—Peter Radkowski
(74) *Attorney, Agent, or Firm*—Oblon, Spivak, McClelland, Maier & Neustadt, L.L.P.

(57) ABSTRACT

An optoelectronic interconnection board on which an optical semiconductor device can be mounted, an optoelectronic interconnection apparatus using the optoelectronic interconnection board, and a manufacturing method thereof are disclosed. According to one aspect of the present invention, there is provided an optoelectronic interconnection board including optical interconnection lines having optical waveguides and electric interconnection lines formed of an electroconductive material, includes a main optical waveguide through which an optical signal is transmitted when an optical functional device is disposed on the optoelectronic interconnection board, a main optical input/output portion which transmits/receives the optical signal to/from the main optical waveguide, a monitoring optical input/output portion which is provided to align with the main optical input/output portion and transmits/receives light to/from the monitoring optical waveguide.

20 Claims, 4 Drawing Sheets

U.S. PATENT DOCUMENTS

| | | | |
|---|---|---|---|
| 6,404,960 B1* | 6/2002 | Hibbs-Brenner et al. | 385/52 |
| 6,453,096 B1* | 9/2002 | Kim et al. | 385/52 |
| 6,483,969 B1* | 11/2002 | Yap et al. | 385/52 |
| 6,516,104 B1 | 2/2003 | Furuyama | |
| 6,640,021 B2* | 10/2003 | Pogge et al. | 385/14 |
| 6,690,851 B1* | 2/2004 | Guilfoyle | 385/18 |
| 6,709,607 B2* | 3/2004 | Hibbs-Brenner et al. | 216/24 |
| 6,754,407 B2* | 6/2004 | Chakravorty et al. | 385/14 |
| 6,773,532 B2* | 8/2004 | Wolf et al. | 156/182 |
| 6,804,423 B2* | 10/2004 | Tsukamoto et al. | 385/14 |
| 6,859,470 B2* | 2/2005 | Fu et al. | 372/34 |
| 6,917,731 B2* | 7/2005 | Bennett et al. | 385/15 |
| 6,937,385 B2* | 8/2005 | Bennett et al. | 359/333 |
| 6,941,631 B2* | 9/2005 | Jenner | 29/407.1 |
| 6,987,906 B2* | 1/2006 | Nakama et al. | 385/31 |
| 6,996,305 B2* | 2/2006 | Kim et al. | 385/15 |
| 7,021,833 B2* | 4/2006 | Loh et al. | 385/88 |
| 7,062,117 B2* | 6/2006 | Uchida | 385/14 |
| 7,068,892 B1* | 6/2006 | Lu et al. | 385/52 |
| 7,072,535 B2* | 7/2006 | Uchida | 385/14 |
| 7,112,885 B2* | 9/2006 | Chen et al. | 257/728 |
| 7,120,325 B1* | 10/2006 | Uchida | 385/14 |
| 7,135,777 B2* | 11/2006 | Bakir et al. | 257/773 |
| 7,139,448 B2* | 11/2006 | Jain et al. | 385/14 |
| 7,160,037 B2* | 1/2007 | Dudek et al. | 385/92 |
| 7,197,202 B2* | 3/2007 | Kim et al. | 385/14 |
| 7,197,221 B2* | 3/2007 | Ohtsu et al. | 385/130 |
| 7,209,621 B2* | 4/2007 | Glebov et al. | 385/129 |
| 7,224,857 B2* | 5/2007 | Liu | 385/14 |
| 7,235,150 B2* | 6/2007 | Bischel et al. | 156/212 |
| 7,271,461 B2* | 9/2007 | Dutta | 257/432 |
| 7,289,701 B2* | 10/2007 | Lam et al. | 385/49 |
| 7,333,682 B2* | 2/2008 | Kobayashi et al. | 385/14 |
| 7,334,946 B2* | 2/2008 | Lu | 385/88 |
| 7,346,260 B2* | 3/2008 | Arakida et al. | 385/146 |
| 7,366,380 B1* | 4/2008 | Peterson et al. | 385/47 |
| 7,382,960 B2* | 6/2008 | Ohtsu et al. | 385/130 |
| 7,387,913 B2* | 6/2008 | Yoshimura et al. | 438/118 |
| 2002/0110328 A1* | 8/2002 | Bischel et al. | 385/49 |
| 2002/0181882 A1* | 12/2002 | Hibbs-Brenner et al. | 385/52 |
| 2003/0133668 A1* | 7/2003 | Wagner et al. | 385/65 |
| 2003/0174419 A1* | 9/2003 | Kindler et al. | 359/819 |
| 2003/0184846 A1* | 10/2003 | Bennett et al. | 359/333 |
| 2003/0185483 A1* | 10/2003 | Bennett et al. | 385/14 |
| 2003/0185485 A1* | 10/2003 | Bennett et al. | 385/14 |
| 2003/0185486 A1* | 10/2003 | Bennett et al. | 385/15 |
| 2003/0185518 A1* | 10/2003 | Bennett et al. | 385/53 |
| 2003/0223683 A1* | 12/2003 | Bennett et al. | 385/24 |
| 2004/0001717 A1* | 1/2004 | Bennett et al. | 398/92 |
| 2004/0008952 A1* | 1/2004 | Kragl | 385/88 |
| 2004/0017602 A1* | 1/2004 | Bennett et al. | 359/333 |
| 2004/0017977 A1* | 1/2004 | Lam et al. | 385/49 |
| 2004/0028323 A1* | 2/2004 | Bennett et al. | 385/24 |
| 2004/0096152 A1* | 5/2004 | Nakama et al. | 385/31 |
| 2004/0105611 A1* | 6/2004 | Bischel et al. | 385/14 |
| 2004/0151441 A1* | 8/2004 | Bennett et al. | 385/92 |
| 2004/0208416 A1* | 10/2004 | Chakravorty et al. | 385/14 |
| 2004/0212030 A1* | 10/2004 | Asai | 257/432 |
| 2004/0228584 A1* | 11/2004 | Dudek et al. | 385/89 |
| 2004/0240805 A1* | 12/2004 | Vakhshoori et al. | 385/98 |
| 2004/0247236 A1* | 12/2004 | Yoshimura et al. | 385/16 |
| 2004/0258347 A1* | 12/2004 | Gothoskar et al. | 385/14 |
| 2004/0263845 A1* | 12/2004 | Schaller et al. | 356/399 |
| 2005/0046928 A1* | 3/2005 | Bischel et al. | 359/341.3 |
| 2005/0111781 A1* | 5/2005 | Jain et al. | 385/15 |
| 2006/0018588 A1* | 1/2006 | Uchida | 385/14 |
| 2006/0062512 A1* | 3/2006 | Lee et al. | 385/15 |
| 2006/0067608 A1* | 3/2006 | Kobayashi et al. | 385/14 |
| 2006/0093010 A1* | 5/2006 | Sekiya et al. | 372/99 |
| 2006/0133718 A1* | 6/2006 | Liu | 385/14 |
| 2006/0171627 A1* | 8/2006 | Aoki et al. | 385/14 |
| 2006/0198569 A1* | 9/2006 | Ohtsu et al. | 385/14 |
| 2006/0215963 A1* | 9/2006 | Hamano | 385/49 |
| 2006/0245681 A1* | 11/2006 | Uchida | 385/14 |
| 2007/0013061 A1* | 1/2007 | Chen et al. | 257/728 |
| 2007/0019914 A1* | 1/2007 | Ohtsu et al. | 385/89 |
| 2007/0047886 A1* | 3/2007 | Gorczyca | 385/129 |
| 2007/0063342 A1* | 3/2007 | Chen et al. | 257/728 |
| 2007/0104416 A1* | 5/2007 | Shimizu et al. | 385/14 |
| 2007/0110373 A1* | 5/2007 | Dudek et al. | 385/89 |
| 2007/0140627 A1* | 6/2007 | Lu | 385/89 |
| 2007/0140633 A1* | 6/2007 | Ohtsu et al. | 385/115 |
| 2007/0147729 A1* | 6/2007 | Dellmann et al. | 385/14 |
| 2007/0217750 A1* | 9/2007 | Budd et al. | 385/89 |
| 2007/0223935 A1* | 9/2007 | Asai et al. | 398/164 |
| 2007/0248139 A1* | 10/2007 | Bischel et al. | 372/75 |
| 2008/0044127 A1* | 2/2008 | Leising et al. | 385/14 |
| 2008/0095499 A1* | 4/2008 | Oda et al. | 385/52 |

* cited by examiner

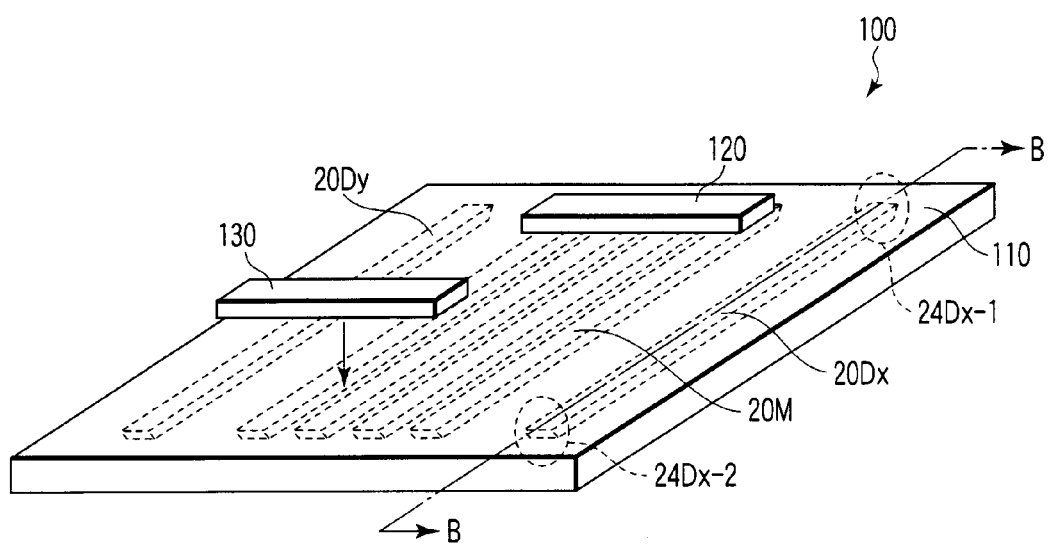
F I G. 4A
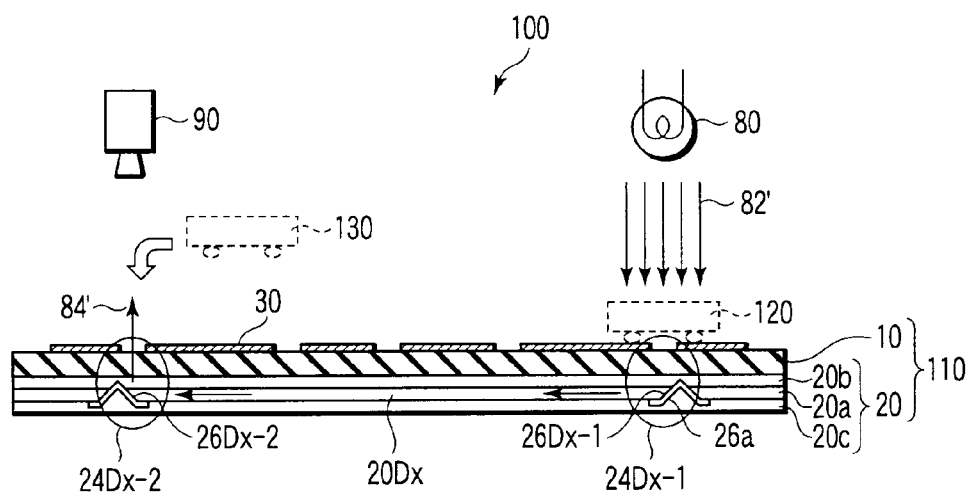
F I G. 4B

OPTOELECTRONIC INTERCONNECTION BOARD, OPTOELECTRONIC INTERCONNECTION APPARATUS, AND MANUFACTURING METHOD THEREOF

CROSS-REFERENCE TO RELATED APPLICATIONS

This application is based upon and claims the benefit of priority from prior Japanese Patent Application No. 2006-350007, filed Dec. 26, 2006, the entire contents of which are incorporated herein by reference.

BACKGROUND OF THE INVENTION

1. Field of the Invention

The present invention relates to an optoelectronic interconnection board, an optoelectronic interconnection apparatus using the optoelectronic interconnection board, and a manufacturing method thereof, and more particularly to an optoelectronic interconnection board on which a semiconductor device is mounted with high alignment accuracy, an optoelectronic interconnection device using the optoelectronic interconnection board, and a manufacturing method thereof.

2. Description of the Related Art

The operating speed of large scale integrated circuits (LSIs) is increasing every year due to improvements in performance of electronic devices, e.g., field-effect or bipolar transistors constituting the LSI.

However, the operating speed on the level of a printed wiring board having an LSI mounted thereon is slower than the internal operating speed of the LSI, and the operating speed becomes slower on the level of a rack having the printed wiring board mounted thereon. Such a reduction in operating speed occurs due to an increase in, e.g., transmission loss and/or noise, or electromagnetic interference in electric interconnection lines outside the LSI which is caused by an increase in an operating speed of the LSI, i.e., an increase in operating frequency. Therefore, the operating speed of a longer interconnection line has to be reduced to avoid degradation in signal quality. In other words, even if the operating speed of the LSI as an active device is increased, the operating speed of a system is constrained to be decreased due to reduced operating speed in the electric interconnection lines outside the LSI by mounting on the board or rack. In recent years, there is an increasing tendency that the operating speed of the entire system is dominated by mounting technology rather than operating speed of the LSI.

With such a problem of an electric interconnection apparatus, an optical interconnection apparatus which optically connects LSIs with each other has been proposed. Characteristics of optical interconnection lie in that frequency dependence, e.g., of loss, is rarely present in a wide frequency range of 100 GHz or more from a direct current, and interconnection of several tens of Gbps is readily realized because of absence of electromagnetic interference or ground bounce noise in interconnection paths, and others.

Therefore, in the optical interconnection apparatus, operation at a very high speed can be expected even on the level of a printed wiring board or the level of a rack, and studies and development are actively underway. Among others, an optoelectronic interconnection apparatus using an optoelectronic interconnection board in which optical interconnection lines and electric interconnection lines are incorporated is disclosed in, e.g., Japanese Patent No. 3612243 or Y. Ishii, et al.; Proc. Electronic Components and Technology Conference, IEEE, p. 870, 2001.

BRIEF SUMMARY OF THE INVENTION

According to one aspect of the present invention, there is provided an optoelectronic interconnection board including optical interconnection lines having optical waveguides and electric interconnection lines formed of an electroconductive material, comprising: a main optical waveguide through which an optical signal is transmitted when an optical functional device is disposed on the optoelectronic interconnection board; a main optical input/output portion which transmits/receives the optical signal to/from the main optical waveguide; a monitoring optical input/output portion which is provided to align with the main optical input/output portion and transmits/receives light to/from the monitoring optical waveguide.

According to another aspect of the present invention, there is provided an optoelectronic interconnection apparatus comprising: an optoelectronic interconnection board including optical interconnection lines having optical waveguides and electric interconnection lines formed of an electroconductive material, the optoelectronic interconnection board comprising: a main optical waveguide through which an optical signal is transmitted; first and second main optical input/output portions which transmit/receive the optical signal to/from the main optical waveguide; a monitoring optical waveguide which is independent from the main optical waveguide; and first and second monitoring optical input/output portions which are provided to respectively align with the first and second main optical input/output portions and transmit/receive light to/from the monitoring optical waveguide; a first optical functional device which is disposed on the optoelectronic interconnection board and transmits/receives the optical signal to/from the main optical waveguide through the first main optical input/output portion; and a second optical functional device which is disposed on the optoelectronic interconnection board and transmits/receives the optical signal to/from the main optical waveguide through the second main optical input/output portion, wherein the first and second monitoring optical input/output portions are provided on the optoelectronic interconnection board outside a region where the first and second optical functional devices are disposed.

According to another aspect of the present invention, there is provided a manufacturing method of an optoelectronic interconnection apparatus which mounts an optical functional device having an optical active portion on an optoelectronic interconnection board including optical interconnection lines having optical waveguides and electric interconnection lines formed of an electroconductive material, comprising: detecting a monitoring light output from a monitoring optical input/output portion connected with a monitoring optical waveguide of the optoelectronic interconnection board, the monitoring optical waveguide being provided on the optoelectronic interconnection board independently from a main optical waveguide through which an optical signal is transmitted/received to/from the optical functional device via a main optical input/output portion, the monitoring optical input/output portion being provided close to the main optical input/output portion connected with the main optical waveguide; and arranging the optical functional device on the optoelectronic interconnection board at a position where the optical active portion of the optical functional device is coupled with the main optical input/output portion but not coupled with the monitoring optical input/output portion while the detected monitoring light being determined as an alignment reference.

BRIEF DESCRIPTION OF THE SEVERAL VIEWS OF THE DRAWING

FIGS. 4A and 4B are views showing an example of manufacturing processes of the optoelectronic interconnection apparatus following FIGS. 3A and 3B according to the second embodiment;

DETAILED DESCRIPTION OF THE INVENTION

Figure 1:
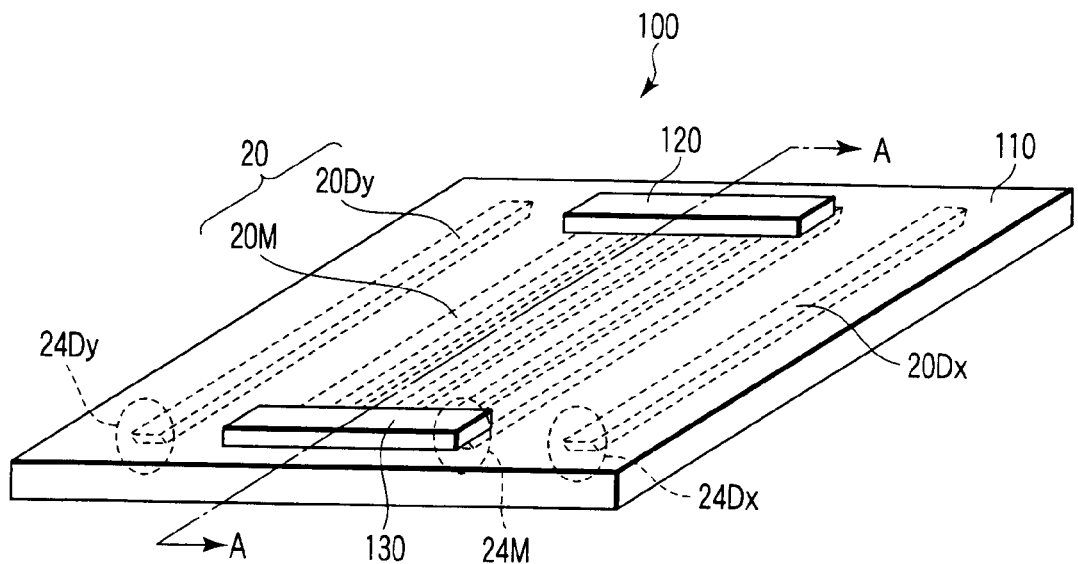
FIG. 1 is a perspective view showing an example of an optoelectronic interconnection apparatus using an optoelectronic interconnection board according to a first embodiment of the present invention.

The present invention discloses an optoelectronic interconnection board on which, e.g., an optical semiconductor device can be mounted with high alignment accuracy, an optoelectronic interconnection apparatus using the optoelectronic interconnection board, and a manufacturing method thereof.

In a conventional technology as disclosed in Japanese Patent No. 3612243 or the document by Y. Ishii, et al., an optical input/output portion of an optical interconnection line is formed by subjecting an end of an optical waveguide to a mechanical work, e.g., vertical facet machining or 45° mirror machining, to bend a light propagating direction by 90°. However, an accuracy of machining is generally lower than an accuracy of photolithography, and it is often the case that alignment accuracy between optical interconnection line subjected to the mechanical process and electric interconnection line patterned by photolithography is poorer than alignment accuracy between electric interconnection lines patterned by photolithography. In particular, when performing 45° mirror machining, a mirror forming position, a mirror angle, or a mirror forming direction may vary depending on machining accuracy, and an optical axis of input/output light in an optical interconnection line may vary in some cases. In the conventional technology, an optical functional device, e.g., a light emitting device or a light receiving device, is mounted on the optoelectronic interconnection board by using an electric interconnection pattern as an alignment reference. Therefore, there is a problem that alignment accuracy of an input/output optical axis of the optical interconnection line and the optical functional device is low. That is, even if the optical interconnection pattern is accurately formed, a displacement of an optical axis of output light often occurs.

In contrast, in an optoelectronic interconnection board according to an embodiment of the present invention, a monitoring optical interconnection line is provided in addition to a main optical interconnection line through which an optical signal is transmitted. As output light from the monitoring optical interconnection line is used as an alignment reference, a relative position of optical axis of the main optical interconnection line can be accuracy determined when mounting and optically coupling the optical functional device, e.g., a semiconductor light emitting device, a semiconductor light receiving device, or an external optical waveguide (e.g., an optical fiber or another optoelectronic interconnection board) with the main optical interconnection line, thereby highly accurately mounting the optical functional device onto the optoelectronic interconnection board.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit.

FIRST EMBODIMENT

FIG. 1 is a perspective view showing an example of an optoelectronic interconnection board and an optoelectronic interconnection apparatus according to a first embodiment of the present invention. In the drawing, optical interconnection lines and optical functional devices alone are depicted for simplification, and other electric interconnection lines, semiconductor devices, or electronic components except the optical functional devices are omitted.

Here, an optoelectronic flexible printed circuit (FPC) will be explained as an example of the optoelectronic interconnection board. However, the present invention is not limited thereto, a rigid board like a general printed wiring board (PWB) can be likewise embodied, and various kinds of materials for such a board can be applied. For example, as an interconnection board material, it is possible to apply a glass epoxy as a general PWB material, polyimide as a general FPC material, a fluorinated resin used for a low-permittivity substrate, or various kinds of ceramic materials used for a high-frequency substrate or a heat-resisting substrate. Furthermore, as an optical waveguide material, it is possible to employ various kinds of materials, e.g., an acrylic material, a silicone-based material, or a polyimide-based material, or a composite material thereof. Moreover, an optical or electric interconnection pattern or the number of interconnection lines may be determined in accordance with an application of the optoelectronic interconnection board, any end structure of the optical waveguide (an optical input/output portion structure) may be employed, and the present invention is not limited thereto.

Figure 2:
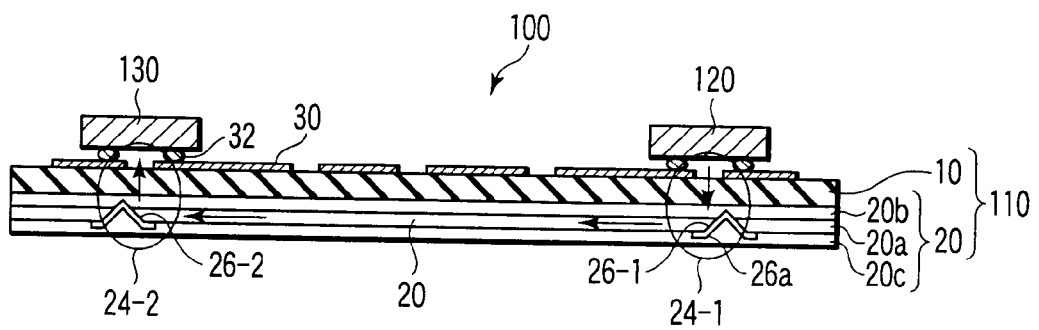
FIG. 2 is a cross-sectional view showing the optoelectronic interconnection apparatus of FIG. 1 using the optoelectronic interconnection board according to the first embodiment.

In FIG. 1, reference number 100 denotes an optoelectronic interconnection apparatus, 110 denotes an optoelectronic interconnection board, 120 denotes a semiconductor light emitting device (a single element or an arrayed element), 130 denotes a semiconductor light receiving device (a single element or an arrayed element), 20 denotes an optical interconnection line (an optical waveguide), and 24 denotes an optical input/output portion. Positions of the semiconductor light emitting device 120 and the semiconductor light receiving device 130 may be interchanged, and a light transmitting direction is reversed in such a case. Main optical interconnection line(s) 20M, which actually function as a signal interconnection line, and monitoring optical interconnection line(s) 20D are provided on the optoelectronic interconnection board 110. Instead of forming the optical interconnection line 20 inside of optoelectronic interconnection board 110, as shown in FIG. 2 described later, each optical interconnection line 20 may be formed on a front surface or a rear surface of the optoelectronic interconnection board 110. Additionally, as explained above, the main optical interconnection line 20M may be a single line or multiple lines. Each optical interconnection line (an optical waveguide) 20 is also called an optical interconnection channel. In the drawing, two monitoring optical interconnection lines 20Dx and 20Dy are arranged in parallel and on each side of the main optical interconnection lines 20M, respectively. A width of spacing between the monitoring optical interconnection line 20D and the main optical interconnection line 20M may be set wider than a width of spacing between the main optical interconnection lines 20M so that the monitoring optical interconnection line (s) 20D can be readily identified.

FIG. 2 is a view showing a cross-sectional structure of the optoelectronic interconnection apparatus 100 taken along a cutting-plane line A-A depicted in FIG. 1. In FIG. 2, reference number 10 denotes an optoelectronic interconnection board substrate, 20 denotes an optical interconnection line (an optical waveguide), 30 denotes an electric interconnection line, and 32 denotes a bump metal (e.g., a solder bump or an Au stud bump). The semiconductor light emitting device 120 and the semiconductor light receiving device 130 transmit/receive an optical signal to/from each other through the optical waveguide as the optical interconnection line 20.

The optoelectronic interconnection board substrate 10 of the optoelectronic interconnection board 110 is an FPC substrate film, e.g., a polyimide film having a thickness of 25 μm. The optical waveguide 20 includes an optical waveguide core 20a and clads 20b and 20c for optical confinement. The optical waveguide core 20a is formed of, e.g., a transparent epoxy resin having a thickness of 40 μm and a width of 40 μm, and the clads 20b and 20c are made of, e.g., a transparent epoxy resin having a thickness of 15 μm above or below the optical waveguide core 20a and having a lower refractive index than that of the optical waveguide core 20a. The optical interconnection line 20 includes a vertically reflecting mirror (a 45° mirror) 26 at the optical input/output portion 24 formed by machining the optical waveguide core 20a at 45° and providing a reflecting metal 26a (e.g., Au) on the machined surface. As a structure of the optical input/output portion 24 (an end structure of the optical waveguide), for example, a diffraction grating can be used besides the 45° mirror, and any structure which can redirect an optical signal towards a desired direction can be employed. The electric interconnection line 30 is, e.g., a copper (Cu) interconnection line having a thickness of 12 μm, and a connecting portion to the bump metal 32 is plated with, e.g., Ni and Au in advance. It is to be noted that the optoelectronic interconnection board 110 can have a structure in which the electric interconnection line is directly formed on the optical waveguide without using the optoelectronic interconnection board substrate 10 or any other structure.

As indicated by arrows in FIG. 2, an optical signal is output from the semiconductor light emitting device 120, then reflected in a horizontal direction by a first 45° mirror 26-1 at a first optical input/output portion 24-1, and transmitted through the optical waveguide core 20a. Further, the signal is reflected in a vertical direction by a second 45° mirror 26-2 at a second optical input/output portion 24-2 on the opposite side of the optical waveguide core 20a.

Here, each of the optical functional devices (the semiconductor light emitting device 120 and the semiconductor light receiving device 130) is shown as an array element in which a plurality of optical active portions (the light emitting portions or the light receiving portions) are aligned in line at predetermined intervals, as shown in FIG. 1. An optical input/output portion 24M of each main optical interconnection line 20M is provided on the optoelectronic interconnection board 110 to be coupled with corresponding optical active portions of the optical functional devices. As shown in FIG. 1, in this example, the plurality of main optical interconnection lines 20M are arranged in parallel, and the monitoring optical interconnection lines 20D are disposed on both sides of these main optical interconnection lines apart a predetermined distance therefrom. Therefore, the plurality of 45° mirrors 26 are provided to be linearly arranged at predetermined intervals.

Each of the optical functional devices 120 and 130 is mounted in such a manner that a position of its optical active portion couples with an optical axis of each main optical interconnection line 20M at each main optical input/output portion 24M, and connected with the electric interconnection line 30 through the bump metal 32. The 45° mirror 26 can be processed by a method, e.g., dicing using a diamond blade having a 45° cross section or laser ablation by irradiating an excimer laser beam or a $CO_2$ laser beam from a 45° oblique direction. A reflecting metal 26a (e.g., Au) is deposited on the 45° processed surface after 45° processing.

Figure 3A:
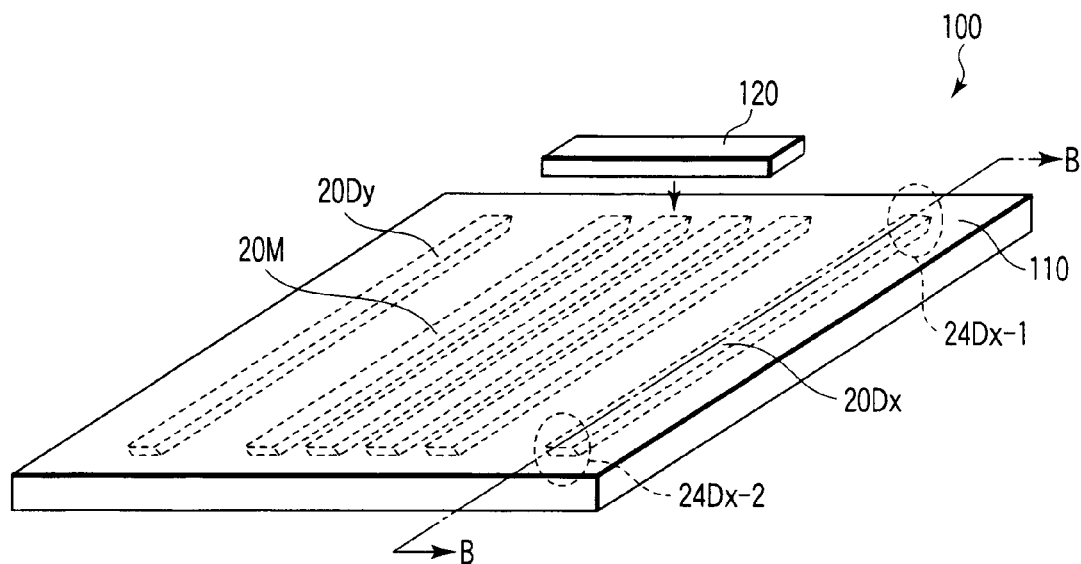
FIGS. 3A and 3B are views showing an example of manufacturing processes of an optoelectronic interconnection apparatus according to a second embodiment of the present invention.
Figure 3B:
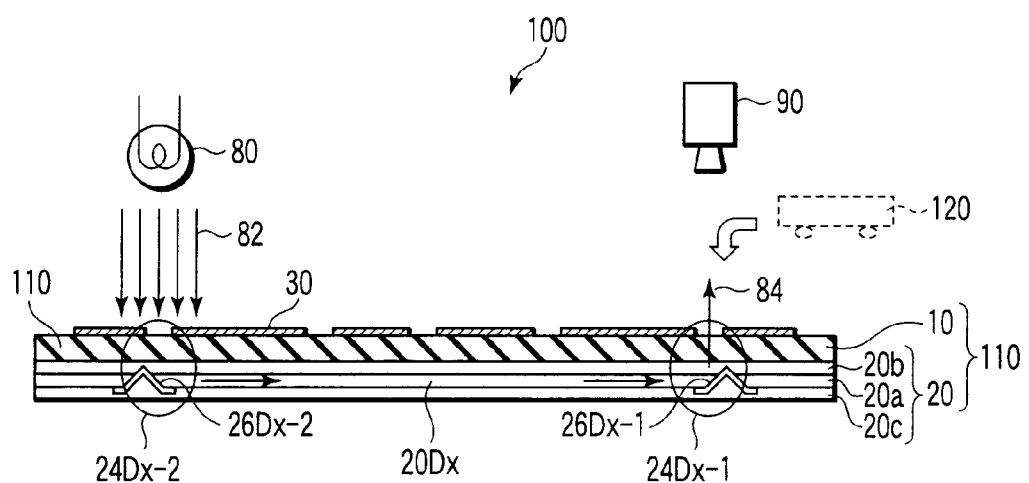

When forming main 45° mirrors of the main optical interconnection lines 20M, 45° mirror(s) of the monitoring optical interconnection line(s) 20D (monitoring 45° mirror(s) 26Dx depicted in FIG. 3B) are also formed to align with and on an extension of a straight line on which the main 45° mirror is provided, thereby forming monitoring optical input/output portion(s) 24D. At this time, it is desirable that the main 45° mirror and the monitoring 45° mirror are simultaneously processed at the same processing step to obtain optically equivalent characteristics and processing accuracy. In particular, in machining, e.g., dicing, these mirrors are provided in a straight line to be collectively machined by a single scanning operation. Furthermore, the monitoring optical input/output portion 24D is provided at a position where it does not covered by the optical functional device 120 or 130 optically coupled with the main optical input/output portion 24M.

With such a structure, position(s) of the main optical input/output portion(s) 24M of the main optical interconnection line 20M can be confirmed even after mounting the optical functional device 120 and/or 130. That is, even if the optical functional device 120 or 130 is mounted and the position of the main optical input/output portion 24M of each main optical interconnection line 20M cannot be directly detected, it is possible to grasp the position of the main optical input/output portion 24M of each main optical interconnection line 20M from an intersection of a straight light connecting the monitoring optical input/output portions 24Dx and 24Dy on both sides and the extension of each main optical interconnection line 20M.

As explained above, in this embodiment, the position of the main optical input/output portion 24M can be determined even after the optical functional device 120 and/or 130 is mounted. A position of the optical active portion can be determined from outer shapes of the optical functional devices 120 and/or 130. By comparing determined positions of the main optical input/output portion 24M and the optical active portion with each other, mounting inclinations and/or mounting displacements of the optical functional devices 120 and 130 can be confirmed.

SECOND EMBODIMENT

The optoelectronic interconnection board 110 explained in conjunction with the first embodiment can not only confirm a displacement of a mounted position of the optical functional devices 120 and 130 but also be utilized in an optoelectronic interconnection apparatus 110 on which the optical functional devices 120 and 130 are mounted and a manufacturing process thereof. Manufacturing processes of the optoelectronic interconnection apparatus 100 using the optoelectronic interconnection board 110 according to a second embodiment of the present invention will now be explained with reference to FIGS. 3A, 3B, 4A, and 4B. FIGS. 3A and 4A are perspective views, and FIGS. 3B and 4B are cross-sectional views including a monitoring optical interconnection line 20Dx taken along a cutting-plane line B-B depicted in FIGS. 3A and 4A.

FIGS. 3A and 3B are views for explaining processes of mounting a first optical functional device (e.g., the semiconductor light emitting device 120) on the optoelectronic interconnection board 110 to which main optical interconnection lines 20M and monitoring optical interconnection lines 20D are provided. First, an optical axis identifying illumination light (or a monitoring optical signal) 82 from a light source 80*a* is irradiated on a second monitoring optical input/output portion 24Dx-2 placed on the opposite side of a position where the first optical functional device 120 should be mounted (a position corresponding to 24-1 in FIG. 2). The illumination light 82 which has entered from the second monitoring optical input/output portion 24Dx-2 is led to a monitoring optical waveguide 20Dx by a second monitoring 45° mirror 26Dx-2, reflected by a first monitoring 45° mirror 26Dx-1 on the opposite side, and output from a first monitoring optical input/output portion 24Dx-1 as indicated by arrows in FIG. 3B. A photodetector 90 detects the output illumination light 84. As the photodetector 90, for example, an image identifying camera can be used. The output illumination light 84 is light transmitted through the monitoring optical interconnection line 20Dx, i.e., light reflected by the monitoring 45° mirrors 26Dx-2 and 26Dx-1 and led through the monitoring optical waveguide 20Dx. Here, since the monitoring optical input/output portion 24Dx-1 is simultaneously provided and aligned with the main optical input/output portion 24M, these portions 24Dx, 24M are optically equivalent to each other, and their optical axes are parallel to each other. Therefore, when output light from the monitoring optical interconnection line 20Dx is determined as a reference, the first optical functional device 120 is positioned accurately for mounting. Thus, the first optical functional device 120 and an optical axis of the main optical input/output portion 24M can be accurately coupled even if there are pattern displacements between an optical interconnection pattern and an electric interconnection pattern. That is, the optical axis of the monitoring optical input/output portion 24Dx-1 accurately represents the optical axis of each main optical input/output portion 24M of the main optical interconnection line 20M.

In FIG. 3A, the alignment method of using one monitoring optical interconnection line, e.g., the first monitoring optical interconnection line 20Dx, to mount the first optical functional device 120 has been explained. However, when the two monitoring optical interconnection lines 20Dx and 20Dy are used to perform alignment, further accurate alignment can be realized. The two monitoring optical interconnection lines 20Dx and 20Dy are arranged to sandwich the main optical interconnection lines 20M therebetween, and the monitoring optical input/output portions 24D and the main optical input/output portions 24M are provided on the same straight line. Therefore, optical axes of the plurality of main optical input/output portions 24M of the respective main optical interconnection lines 20M are placed on a straight line connecting optical axes of illumination light output from, e.g., two first monitoring optical input/output portions 24Dx-1 and 24Dy-1 of the two monitoring optical interconnection lines 20Dx and 20Dy. Thus, inclinations and other differences between a straight line on which the optical active portions of the optical functional device are arranged and the straight line on which the main optical input/output portions 24M are arranged can be readily confirmed and instantaneously fed back to a mounting apparatus with which the optical functional devices are mounted on the optoelectronic interconnection board. Moreover, even if each 45° mirror 26 is not correctly provided in a direction which is not perpendicular to the optical axis of each optical interconnection line 20 due to an error in processing, the optical axes of the output illumination light from the two first monitoring optical input/output portions 24Dx-1 and 24Dy-1 are determined as alignment references, and the optical active portion(s) of the first optical functional device 120 can be placed at place(s) accurately aligned with the straight line connecting these optical axes, thereby accurately mounting the first optical functional device 120 on the optoelectronic interconnection board 110.

When the output light from each monitoring optical interconnection line 20D detected by the photodetector 90 is determined as the alignment reference in this manner, the first optical functional device 120 and each main optical interconnection line 20M can be directly and accurately aligned and optically coupled.

It is to be noted that, when mounting the first optical functional device 120, no obstacle is placed on an optical path of each main optical interconnection line 20M which is actually used for optical interconnection. Therefore, the main optical interconnection line 20M itself can be used in place of the monitoring optical interconnection line 20D in the alignment described above.

Processes of mounting a second optical functional device (e.g., a semiconductor light receiving device 130) will now be explained with reference to FIGS. 4A and 4B. The illumination light is incident from a position opposite to that depicted in FIGS. 3A and 3B. That is, illumination light 82' is allowed to enter from the first monitoring optical input/output portion 24Dx-1 on the side where the first optical light functional device 120 has been already mounted, and the photodetector 90 detects illumination light 84' exiting from the second monitoring optical input/output portion 24Dx-2 on the opposite side. In this case, the first light functional device 120 has been already mounted on an optical path of the main optical interconnection line 20M. Therefore, the main optical interconnection line 20M cannot be utilized for alignment, but the monitoring optical interconnection line 20D alone can be used.

As in the case of mounting the first optical functional device 120, the photodetector 90 detects an optical axis of the illumination light 84' exiting from a second monitoring optical input/output portion 24Dx-2. Using the detected optical axis of the exiting light 84' as an alignment reference, the second optical functional device 130 is mounted. As a result, the second optical functional device 130 is coupled with a corresponding electric interconnection line 30.

Like mounting the first optical functional device 120, using the two monitoring optical interconnection lines 20Dx and 20Dy provided on both sides of the main optical interconnection lines 20M enables further accurate alignment of the optical axes.

When the monitoring optical interconnection lines 20D are used in this manner, the optical functional devices 120 and 130 can be mounted to allow the optical active portions of the optical functional devices 120 and 130 to be directly and accurately coupled with the main optical input/output portions 24M of the respective main optical interconnection lines 20M irrespective of whether the optical functional devices 120 and 130 are mounted on the optical paths of the main optical interconnection lines 20M or not. Therefore, there is provided a manufacturing method of the optoelectronic interconnection apparatus which suppresses degradation in interconnection performance due to misalignment between the optical active portions of the optical functional devices and the optical input/output portions of the optical interconnection lines.

The example where one optical functional device has the plurality of optical active portions, e.g., a semiconductor light emitting device array or a semiconductor light receiving device array, has been explained in conjunction with the foregoing embodiment. If the optical functional device has a single optical interconnection channel with one optical active portion, then sufficient coupling accuracy can be achieved by disposing just one monitoring optical interconnection line.

Another advantage of disposing the monitoring optical interconnection lines 20D lies in that actual optical transmission characteristics of the optoelectronic interconnection board 110 can be monitored after assembling the optoelectronic interconnection apparatus 100. As explained above, the monitoring optical interconnection line 20D is simultaneously formed by the same method as the main optical interconnection line 20M. Therefore, the monitor and main optical interconnection lines 20D and 20M have the same machining variations in manufacturing the optoelectronic interconnection board 110 and experience the same history during and after manufacturing the optoelectronic interconnection apparatus 100, providing substantially the same optical transmission characteristics. Thus, for example, inputting measurement light, i.e., a monitoring signal, equivalent to an actual optical signal from one end of the monitoring optical interconnection lines 20D and then measuring characteristics, e.g., an output light quantity or a waveguide mode pattern, of the monitoring signal output through the monitoring optical interconnection line 20D enables grasping the optical transmission characteristics of the optoelectronic interconnection apparatus 100. As a result, it is possible to confirm whether a problem occurs during an assembling process or an actual operation of the optoelectronic interconnection apparatus 100, thereby readily recognizing if a cause of the problem is present in the optical functional device 120 or 130 or the optoelectronic interconnection board 110. As explained above, it is possible to easily perform operation failure analysis or quality confirmation in assembling the optoelectronic interconnection device 100 by mounting components on the optoelectronic interconnection board 110.

According to the embodiment of the present invention, optical axis alignment or coupling between the optical functional device, e.g., an optical semiconductor element or an external optical waveguide, and the optical interconnection line can be accurately performed while allowing displacement between an electric interconnection pattern formed by photolithography and the optical input/output portion of the optical interconnection line formed by machining. As a result, it is possible to provide the optoelectronic interconnection board on which the optical semiconductor elements can be mounted with high alignment accuracy, the optoelectronic interconnection apparatus using the optoelectronic interconnection board, and the manufacturing method thereof.

It is to be noted that the present invention is not necessarily limited to an example shown in the foregoing embodiment in which monitoring light is input from monitoring optical input/output portion of the monitoring optical interconnection line at a place where the optical functional device is not mounted and the monitoring light is output from another monitoring optical input/output portion of the monitoring optical interconnection line at a place where the optical functional device is to be mounted. For example, although the monitoring optical input/output portion which outputs the monitoring light is provided on the same straight line as the main optical input/output portion to be positioned, the monitoring optical input/output portion, which inputs the monitoring light, on the other side of the monitoring optical interconnection line may be interconnected with a pattern different from that of the main optical interconnection line, for example, the monitoring interconnection optical line may be optically connected with, e.g., a dedicated monitoring optical input end portion at which a dedicated monitoring light source is provided. When such a structure is adopted, a monitoring light output with a constantly stable luminance can be obtained without being dependent on a status of a member mounted on the optoelectronic interconnection board or a relative position with respect to an illumination serving as the monitoring light.

MODIFICATION 1

Figure 5A:
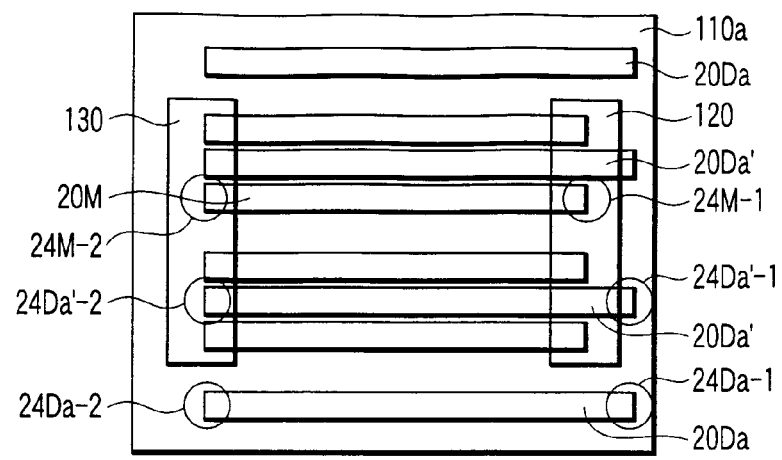
FIGS. 5A to 5C are plan views for explaining examples of Modification 1 of the present invention.
Figure 5B:
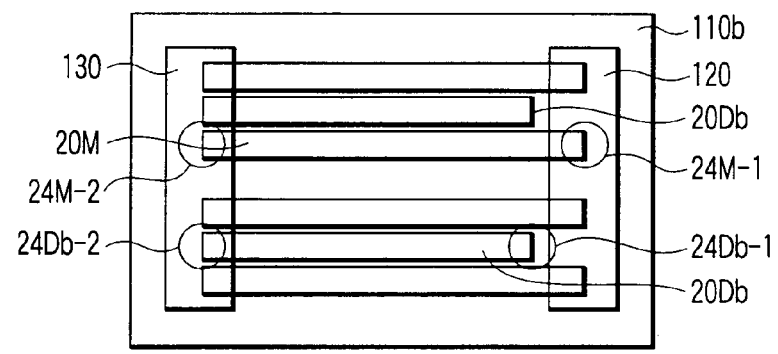
Figure 5C:
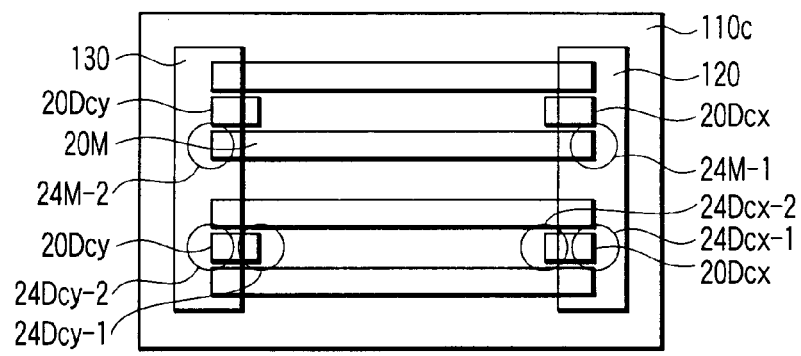

The present invention is not limited to the foregoing embodiments. Modification 1 according to the present invention provides an optoelectronic interconnection board obtained by modifying the monitoring interconnection line to have a length different from that of the main interconnection line. FIGS. 5A to 5C are examples of plan view for explaining Modification 1. As shown in FIG. 5A, an example in Modification 1 provides an optoelectronic interconnection board 110a in which monitoring optical interconnection lines 20Da and 20Da' are provided to be longer than the main optical interconnection lines 20M and first monitoring optical input/output portions 24Da-1 and 24Da'-1 on one end are positioned at places where they do not overlap an optical functional device 120. When such an arrangement is adopted, the monitoring optical interconnection line 20Da can be not only provided outside the main optical interconnection line 20M but also provided in a region between the plurality of main optical interconnection lines 20M, as the monitoring optical interconnection line 20Da' shown in FIG. 5A. For the main optical interconnection line 20M and the monitoring optical interconnection lines 20Da and 20Da', the first main optical input/output portion 24M-1 and the first monitoring optical input/output portions 24Da-1 and 24Da'-1 are provided on different straight lines parallel to each other and can be formed by, e.g., laser ablation.

Another example of Modification 1 is an optoelectronic interconnection board 110b formed in such a manner that monitoring optical interconnection lines are not provided on both outer sides of main optical interconnection lines. For example, the optoelectronic interconnection board 110b depicted in FIG. 5B includes the monitoring optical interconnection lines 20Db shorter than the main optical interconnection line 20M provided in space(s) between the main optical interconnection lines 20M only, and a first monitoring optical input/output portion 24Db-1 on one end is provided to be positioned on the inner side of a mounted optical functional device 120.

In the optical interconnection boards 110a and 110b depicted in FIGS. 5A and 5B, the first optical functional device 120 is mounted to optically couple with a plurality of main optical input/output portions 24M-1, which are provided on a straight line different from a line connecting the first monitoring optical input/output portions 24Da'-1 or 24Db-1. At this time, for example, the main optical interconnection line 20M itself can be utilized for alignment by detecting the monitoring light transmitted through it. Then, a second optical functional device 130 is mounted to optically couple with second main optical input/output portions 24M-2, which are provided on the same straight line connecting the second monitoring optical input/output portions 24Da'-2 or 24Db-2, and monitoring light can be allowed to enter from the first monitoring optical input/output portion 24Da'-1 or 24Db-1 provided at a position where it is not covered with the first optical functional device 120.

Still another example of Modification 1 is, as shown in FIG. 5C, an optoelectronic interconnection board 110c in which a pair of first and second monitoring optical interconnection lines 20Dcx and 20Dcy shorter than a ½ of a length of a main optical interconnection line 20M are used. The monitoring optical interconnection lines 20Dcx and 20Dcy are arranged in positions corresponding to optical functional devices 120 and 130, respectively, so that a first monitoring optical input/output portion 24Dcx-1 of the first monitoring optical interconnection lines 20Dcx is provided on a straight line on which the first main optical input/output portions 24M-1 are provided and a second monitoring optical input/output portion 24Dcy-2 of the second monitoring optical interconnection lines 20Dcy is provided on a straight line on which the second main optical input/output portions 24M-2 are provided. In this optoelectronic interconnection board 110c, when mounting one of the two optical functional devices 120 and 130, a corresponding monitoring interconnection line 20Dc in the pair of monitoring optical interconnection lines 20Dcx and 20Dcy can be utilized for alignment based on monitoring light detection since the pair of first and second monitoring optical interconnection lines 20Dcx and 20Dcy are symmetrically arranged in a space between the main optical interconnection lines 20M, and the two optical functional devices 120 and 130 can be mounted on the optoelectronic interconnection board 110c without being limited to a mounting order in particular.

In all of the arrangement examples of the monitoring optical interconnection lines 20D explained according to Modification 1, the monitoring optical interconnection lines 20D can be not only provided on the outer side of the main optical interconnection lines 20M like the first and second embodiments but also provided by utilizing a space between the plurality of main optical interconnection lines 20M.

It is to be noted that, if the monitoring optical interconnection line 20D is provided in the outer side and inner side of the main optical interconnection line 20M in Modification 1, as long as one of outer monitoring optical input/output portions 24D is provided on the same straight line on which one of the main optical input/output portions 24M is provided, another outer monitoring optical input/output portion 24D may be provided either on a strait line on which the main optical input/output portion 24M on the other side is provided, or on the same straight line on which one of the inner monitoring input/output portion 24D of the inner monitoring optical interconnection line 20D is provided, and a position of one of the outer monitoring optical input/output portion 24D is not limited thereto.

MODIFICATION 2

Modification 2 according to the present invention concerns an input/output direction of optical interconnection lines. An optical input/output direction of a main optical interconnection line 20M and a monitoring optical interconnection line 20D can be changed without being limited to the embodiments or the modification. An example of an optoelectronic interconnection board 110d according to Modification 2 will now be explained with reference to a cross-sectional view depicted in FIG. 6.

Figure 6:
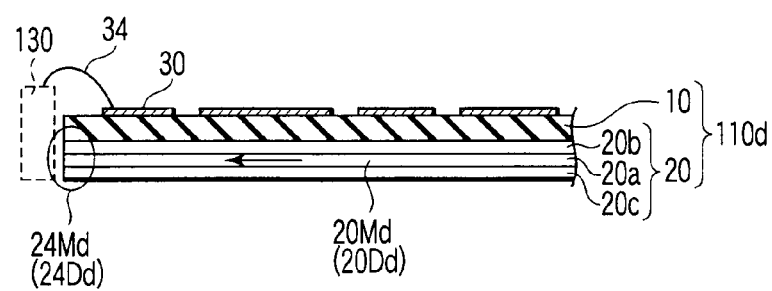
FIG. 6 is a cross-sectional view for explaining an example of Modification 2 of the present invention.

As shown in FIG. 6, Modification 2 is an optoelectronic interconnection board 110d in which a 45° mirror is not provided to at least one side of the optical input/output portions 24Md and 24Dd of optical interconnection lines 20M and 20D, and a facet of the optoelectronic interconnection board 110d is utilized to mount, e.g., an optical functional device 130. The optical functional device 130 mounted on the facet of the optoelectronic interconnection board 110d is connected with an electric interconnection line 30 provided on a surface of the optoelectronic interconnection board 110d through, e.g., a lead wire 34.

In this manner, in the example arrangement of the optical interconnection line 20 explained in conjunction with Modification 2, at least one of the main optical input/output portions 24Md of main optical interconnection lines 20Md and at least one of the monitoring optical input/output portions 24Dd of a monitoring optical interconnection lines 20Dd corresponding each other are both provided on the facets of the optoelectronic interconnection board 110d, respectively, and optical input/output directions of the main optical interconnection line 20Md and the monitoring optical interconnection line 20Dd can be determined as a direction to/from the facet surface of the optoelectronic interconnection board 110d.

Moreover, the present invention is not limited to the above explanation and can be modified and carried out in many ways without being departing from the scope of the invention.

Although the example where the optical functional devices are mounted on the optoelectronic interconnection board has been explained in the foregoing embodiments, the present invention is not limited thereto, and it can include an optical fiber, for example, which couples an optical functional device, e.g., an optical signal transmitting device or an optical signal receiving device, provided outside the optoelectronic interconnection apparatus and an optical input/output portion of an optical interconnection line on the optoelectronic interconnection board with each other. Additionally, a monitoring signal source and a monitoring photodetector can be likewise coupled through, e.g., an optical fiber.

In the foregoing embodiments, the optoelectronic interconnection board is provided that the electric interconnection line is provided on the surface of the optoelectronic interconnection board substrate to mount the semiconductor devices. However, the electric interconnection line can be provided on a surface of the optical waveguide layer on the optoelectronic interconnection board to dispose the optical functional device close to the optical input/output portion. Further, the optoelectronic interconnection board substrate does not have to be used.

In the foregoing embodiments, optical interconnection of connecting the light emitting portion with the light receiving portion in a one-to-one relationship to perform optical communication has been explained. However, the present invention is not limited thereto and, for example, the optical waveguide may be divaricated or coupled to connect the light emitting portion(s) with the light receiving portion(s) in a one-to-many relationship, a many-to-one relationship, or a many-to-many relationship.

In the foregoing embodiments, the example where the 45° mirror is used in the optical input/output portion and the example where the optical input/output portion is provided on the facet without providing elements for bending an optical path have been explained. However, the present invention is not limited thereto and, for example, a diffraction grating, a converging mirror, a photonic crystal and others can be used as the optical input/output portion. Furthermore, an angle of the mirror can be set to an arbitrary angle without being limited to 45°.

Moreover, the number of the monitoring optical interconnection lines is not limited to one or two, and an arbitrary number of lines equal to or more than one can be provided. Additionally, as a structure of such monitoring optical interconnection lines, a simplified structure in which a mirror alone is provided at the optical input/output portion without providing the optical waveguide can be adopted.

As explained above, according to the embodiments of the present invention, optical axis alignment to couple the optical interconnection lines with the optical semiconductor devices or the external optical waveguide can be accurately performed while allowing displacements between electric interconnection lines formed by, e.g., photolithography, and the optical input/output portions of the optical interconnection lines formed by, e.g., machining. As a result, it is possible to provide the optoelectronic interconnection board on which a semiconductor device can be mounted with high alignment accuracy, the optoelectronic interconnection device using the optoelectronic interconnection board, and the manufacturing method thereof.

According to the embodiments of the present invention, even if conventional processing means is used, an optical transmission quality of the optical interconnection portions can be improved, and a production yield of the optoelectronic interconnection device can be enhanced. Therefore, the present invention demonstrates a high industrial value, i.e., an improvement in performance of, e.g., an information communication device based on introduction and promotion of optical interconnection lines and contribution to development of the industry.

Although some specific examples of the embodiments according to the present invention have been explained, they are just examples, and any other elements (e.g., a material or a structure) can be used for each element in accordance with the purpose of the present invention. Further, the foregoing embodiments are examples and can be carried out by combining a plurality of embodiments and/or modifications.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optoelectronic interconnection board including optical interconnection lines having optical waveguides and electric interconnection lines formed of an electroconductive material, comprising:
    an optoelectronic interconnection board substrate;
    a main optical waveguide through which an optical signal is transmitted when an optical functional device is disposed on the optoelectronic interconnection board;
    a main optical input/output portion which transmits/receives the optical signal to/from the main optical waveguide;
    a monitoring optical waveguide which is independent from the main optical waveguide; and
    a monitoring optical input/output portion which is provided to align with the main optical input/output portion and transmits/receives light to/from the monitoring optical waveguide,
    wherein the main optical waveguide, the monitoring optical waveguide, the main optical input/output portion and the monitoring optical input/output portion are provided in the optoelectronic interconnection board substrate.

2. The optoelectronic interconnection board according to claim 1, wherein the monitoring optical input/output portion is optically connected with a second monitoring optical input/output portion or a dedicated monitoring optical input portion through the monitoring optical waveguide.

3. The optoelectronic interconnection board according to claim 1, wherein the monitoring optical input/output portion is provided at two or more positions with respect to a position where the single optical functional device is disposed.

4. The optoelectronic interconnection board according to claim 3, wherein the main optical input/output portion and the monitoring optical input/output portions are provided on the same straight line.

5. The optoelectronic interconnection board according to claim 1, wherein a plurality of main optical waveguides are provided.

6. The optoelectronic interconnection board according to claim 5, wherein a width of spacing between the monitoring optical waveguide and the main optical waveguide is different from a width of spacing between the main optical waveguides.

7. The optoelectronic interconnection board according to claim 5, wherein a length of the monitoring optical waveguide is different from a length of the main optical waveguide.

8. The optoelectronic interconnection board according to claim 7, wherein the monitoring optical waveguide is provided between the plurality of main optical waveguides.

9. The optoelectronic interconnection board according to claim 1, wherein the main optical waveguide and the monitoring optical waveguide are arranged substantially parallel with each other.

10. The optoelectronic interconnection board according to claim 1, wherein each of the main optical input/output portion and the monitoring optical input/output portion includes an element which bends an optical path of the optical signal or the light.

11. The optoelectronic interconnection board according to claim 10, wherein the element which bends the optical path is a 45° mirror.

12. The optoelectronic interconnection board according to claim 10, wherein the element which bends the optical path is one of a diffraction grating, a converging mirror, and a photonic crystal.

13. An optoelectronic interconnection apparatus comprising:
    an optoelectronic interconnection board including optical interconnection lines having optical waveguides and electric interconnection lines formed of an electroconductive material, the optoelectronic interconnection board comprising: an optoelectronic interconnection board substrate, a main optical waveguide through which an optical signal is transmitted; first and second main optical input/output portions which transmit/receive the optical signal to/from the main optical waveguide; a monitoring optical waveguide which is independent from the main optical waveguide; and first and second monitoring optical input/output portions which are provided to respectively align with the first and second main optical input/output portions and transmit/receive light to/from the monitoring optical waveguide, and wherein the main optical waveguide, the monitoring optical waveguide, the main optical input/output portions and the monitoring optical input/output portions are provided in the optoelectronic interconnection board substrate;

a first optical functional device which is disposed on the optoelectronic interconnection board and transmits/receives the optical signal to/from the main optical waveguide through the first main optical input/output portion; and a second optical functional device which is disposed on the optoelectronic interconnection board and transmits/receives the optical signal to/from the main optical waveguide through the second main optical input/output portion, wherein the first and second monitoring optical input/output portions are provided to the optoelectronic interconnection board outside a region where the first and second optical functional devices are disposed.

14. The apparatus according to claim 13, wherein the monitoring optical waveguide is optically equivalent to the main optical waveguide, and the first and second monitoring optical input/output portions are optically equivalent to the first and second main optical input/output portions, respectively.

15. The apparatus according to claim 13, wherein the main optical waveguide and the monitoring optical waveguide are arranged substantially parallel with each other.

16. A manufacturing method of an optoelectronic interconnection apparatus which mounts an optical functional device having an optical active portion on an optoelectronic interconnection board including an optoelectronic interconnection board substrate, optical interconnection lines having optical waveguides and electric interconnection lines formed of an electroconductive material, comprising:

detecting a monitoring light output from a monitoring optical input/output portion in the optoelectronic interconnection board substrate connected with a monitoring optical waveguide in the optoelectronic interconnection board substrate of the optoelectronic interconnection board, the monitoring optical waveguide being provided on the optoelectronic interconnection board independently from a main optical waveguide through which an optical signal is transmitted/received to/from the optical functional device via a main optical input/output portion in the optoelectronic interconnection board substrate, the monitoring optical input/output portion being provided close to the main optical input/output portion connected with the main optical waveguide; and arranging the optical functional device on the optoelectronic interconnection board at a position where the optical active portion of the optical functional device is coupled with the main optical input/output portion but not coupled with the monitoring optical input/output portion while the detected monitoring light being determined as an alignment reference.

17. The method according to claim 16, wherein the monitoring optical input/output portion is provided outside a region where the optical functional device is disposed.

18. The method according to claim 16, wherein the main optical input/output portion and the monitoring optical input/output portion are provided by collective processing.

19. The method according to claim 16, wherein detecting the monitoring light comprises inputting the monitoring light to a second monitoring optical input/output portion or a dedicated monitoring optical input portion connected with the monitoring optical waveguide.

20. The method according to claim 19, wherein a second optical functional device having an optical active portion is mounted on the optoelectronic interconnection board in advance, the optical active portion of the second optical functional device being coupled with a second main optical input/output portion provided on one end of the main optical waveguide opposite to the main optical input/output portion, and wherein the second monitoring optical input/output portion or the dedicated monitoring optical input portion is provided outside a region where the second optical functional device is disposed.

* * * * *